(12) United States Patent
Hammerschmidt

(10) Patent No.: US 9,383,269 B2
(45) Date of Patent: Jul. 5, 2016

(54) CIRCUITS, METHODS, AND COMPUTER PROGRAMS TO DETECT MECHANICAL STRESS AND TO MONITOR A SYSTEM

(71) Applicant: Infineon Technologies AG, Neubiberg (DE)

(72) Inventor: Dirk Hammerschmidt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 33 days.

(21) Appl. No.: 13/963,341

(22) Filed: Aug. 9, 2013

(65) Prior Publication Data
US 2015/0040677 A1 Feb. 12, 2015

(51) Int. Cl.
G01L 1/18 (2006.01)
G01M 5/00 (2006.01)
G01R 31/28 (2006.01)

(52) U.S. Cl.
CPC ............... *G01L 1/18* (2013.01); *G01M 5/0083* (2013.01); *G01R 31/2856* (2013.01); *G01R 31/2881* (2013.01)

(58) Field of Classification Search
CPC .... G01R 31/2831; H01L 27/00; H01L 23/62; H03L 5/00; H02M 1/32; H02M 3/157; H02M 2001/0012; H03K 17/0822; H03K 17/18; H02J 1/00; H05K 1/0268
USPC ................. 73/774, 777, 779; 280/734; 361/90
See application file for complete search history.

(56) References Cited

U.S. PATENT DOCUMENTS 3,815,116 A * 6/1974 Fink ...................... B66C 23/905
212/278
4,179,940 A * 12/1979 Oertle ................. G01M 5/0083
73/799
6,819,539 B1 * 11/2004 Wright ...................... G06F 1/30
361/90
6,948,377 B2 * 9/2005 Wingett ............... G01L 5/0047
73/795
7,353,712 B2 * 4/2008 Ausserlechner ................. 73/777
7,607,828 B2 * 10/2009 Beier et al. ..................... 374/163

(Continued)

FOREIGN PATENT DOCUMENTS

CN 202008415 U * 10/2011
DE 10 2005 029 464 A1 12/2006

OTHER PUBLICATIONS

ISO 26262-1 Road vehicles—Functional safety, Part 1: Vocabulary, Dated Nov. 15, 2011, 32 pages.

(Continued)

*Primary Examiner* — Lisa Caputo
*Assistant Examiner* — Tran M Tran
(74) *Attorney, Agent, or Firm* — Eschweiler & Associates, LLC

(57) ABSTRACT

Embodiments provide a circuit, a method, and a computer program configured to detect mechanical stress and a circuit, a method, and a computer program configured to monitor safety of a system. The detection circuit is configured to detect mechanical stress of a semiconductor circuit. The detection circuit comprises a stress monitor module configured to monitor mechanical stress of the semiconductor circuit and to provide monitor information related to a mechanical stress level of the semiconductor circuit. The detection circuit further comprises an activation signal generator configured to generate an activation signal comprising activation information related to the mechanical stress level of the semiconductor circuit if the monitor information indicates that a mechanical stress level criterion is fulfilled by the semiconductor circuit.

19 Claims, 3 Drawing Sheets

(56) References Cited

U.S. PATENT DOCUMENTS

| | | | |
|---|---|---|---|
| 7,621,190 B2* | 11/2009 | Ahmad | G01R 31/2817 73/862.474 |
| 8,238,068 B2 | 8/2012 | Shannon et al. | |
| 8,442,787 B2* | 5/2013 | Ausserlechner et al. | 702/64 |
| 2007/0063309 A1* | 3/2007 | Ausserlechner | 257/528 |
| 2008/0295605 A1 | 12/2008 | Jang et al. | |
| 2009/0108839 A1 | 4/2009 | Ausserlechner | |
| 2012/0006122 A1 | 1/2012 | Aitken | |
| 2012/0285255 A1 | 11/2012 | Ausserlechner et al. | |

OTHER PUBLICATIONS

ISO 26262-2 Road vehicles—Functional safety, Part 2: Management of Functional Safety, Dated Nov. 15, 2011, 36 pages.

ISO 26262-3 Road vehicles—Functional safety, Part 3: Concept Phase, Dated Nov. 15, 2011, 32 pages.

ISO 26262-4 Road vehicles—Functional safety, Part 4: Product Development at the System Level, Dated Nov. 15, 2011, 48 pages.

ISO 26262-5 Road vehicles—Functional safety, Part 5: Product Development at the Hardware Level, Dated Nov. 15, 2011, 86 pages.

ISO 26262-6 Road vehicles—Functional safety, Part 6: Product Development at the Software Level, Dated Nov. 15, 2011, 52 pages.

ISO 26262-7 Road vehicles—Functional safety, Part 7: Production and Operation, Dated Nov. 15, 2011, 20 pages.

ISO 26262-8 Road vehicles—Functional safety, Part 8: Supporting Processes, Dated Nov. 15, 2011, 60 pages.

ISO 26262-9 Road vehicles—Functional safety, Part 9: Automotive Safety Integrity Level (ASIL)-Oriented and Safety-Oriented Analyses, Dated Nov. 15, 2011, 25 pages.

ISO 26262-10 Road vehicles—Functional safety, Part 10: Guideline on ISO 26262, © 2012, 96 pages.

* cited by examiner

CIRCUITS, METHODS, AND COMPUTER PROGRAMS TO DETECT MECHANICAL STRESS AND TO MONITOR A SYSTEM

TECHNICAL FIELD

Embodiments relate to circuits, methods, and computer programs configured to detect mechanical stress and configured to monitor a safety of a system.

BACKGROUND

Electronic circuits and semiconductors are increasingly used in manifold applications. At the same time, complexity of these circuits and of overall applications increases as well. With the introduction of more and more electronic circuits and semiconductors into applications safety issues arise. For example, systems or applications used in mass or public transportation, as well as in automotive and aviation, are relevant for a safe operation of the respective vehicle. Safety or reliability of these systems and applications may determine the safety of the respective users. International organizations may define standards of functional safety for Electrical and Electronic Systems (EE Systems), for example, ISO 26262 (International Organization for Standardization) or IEC 61508 (International Electrotechnical Commission). One aspect, which may be found in these standards, is the assurance of the independence of blocks that provide redundancy or self-test functionality to achieve a safety goal. For example, in case of independent blocks that are realized on the same semiconductor substrate coupling effects via the substrate may be avoided in order to achieve independence. Some known concepts may avoid a possible coupling effect by using separate substrates to achieve independence of the respective blocks.

One known concept tries to avoid stress to the involved blocks or semiconductors. Special packages or housings can be used, in order to avoid stress. Stress resistant housing may lead to significant cost adders compared to standard packages. Another known concept is stress compensation, which can, for example, be applied to Hall sensors or bandgap references. Here, stress evoked signals may be measured and the output of a stress sensitive circuit may be corrected depending on this measurement. Efforts, for example in terms of measurement circuitry and stress sensors, may generate extra costs. In some applications high accuracy of the measurements may be used and correction may be limited to a normal operating range of the respective circuit or semiconductor at which the measurements are carried out and compensated. If a defined operating range is exceeded significantly the accurate stress compensation of measurement circuitry may fail and lead to wrong calculations, disadvantageous or potentially dangerous effects.

SUMMARY

Embodiments provide a detection circuit configured to detect mechanical stress of a semiconductor circuit. The detection circuit comprises a stress monitor module configured to monitor mechanical stress of the semiconductor circuit. The stress monitor module is further configured to provide monitor information related to a mechanical stress level of the semiconductor circuit.

The detection circuit further comprises an activation signal generator configured to generate an activation signal. The activation signal comprises activation information related to the mechanical stress level of the semiconductor circuit if the monitor information indicates that the mechanical stress level criterion is fulfilled by the semiconductor circuit. Embodiments of the detection circuit provide the activation signal which can, for example, indicate that the mechanical stress level of the semiconductor exceeded a certain level. The activation signal may therefore be seen as a warning signal based on which further safety measures may be carried out. In some embodiments the activation signal may be used to trigger safety measures, such as switching off components, reducing power of some components, transferring the semiconductor or a system into a safe state, resetting components, etc.

In some embodiments the mechanical stress level criterion may correspond to exceedance of a stress safety criterion and the activation signal may comprise information related to a warning that the stress safety criterion is exceeded. In some embodiments the detection circuit may monitor the stress by means of at least a resistance or a piezo-resistance measurement at the semiconductor circuit. In order to maintain a certain stress safety criterion, which can, for example, be defined by a standard or by other system parameters, the measured mechanical stress may not exceed a certain level. If the stress level is exceeded, the stress safety criterion may be considered critical and the activation signal may be provided.

In further embodiments the mechanical stress level change or a mechanical stress level change rate of the semiconductor may be monitored. The mechanical stress level criterion may then correspond to a certain stress level change or change rate, which may not be exceeded. For example, certain mechanical stress level change rates may indicate a mechanical failure or a break of the semiconductor, its substrate, respectively. Such a stress level change or change rate may be monitored and when detected, the activation signal may be provided. In some embodiments the activation signal generator may be configured to generate the activation signal when a mechanical failure of the semiconductor is detected based on a mechanical stress level change rate exceeding a mechanical stress level change rate criterion. Some embodiments may therefore enable to apply safety measures when a semiconductor breaks or has a mechanical failure.

Embodiments further provide a safety monitoring circuit, which is configured to monitor a system. The safety monitoring circuit comprises the detection circuit as described above. The safety monitoring circuit further comprises a control module configured to receive the activation signal from the activation signal generator and to apply a safety measure to the system if the activation signal is received. Embodiments may provide control over a system, such that failure of one semiconductor in the system can be detected and according safety measures can be applied to the system, for example, to components outside of the semiconductor circuit. Embodiments may enable the maintenance of a stress safety criterion of the system based on the activation signal.

In embodiments the safety measures may correspond to switching off the system or the semiconductor at least partly, switching off power components or drivers for power components, transfer of the system or at least parts thereof in a safety state, etc. In some embodiments the control module may be configured to transfer the semiconductor circuit or the system from a normal operating state into a safe operating state if the activation signal is received. The safe operating state is a state in which consequences of a failure of the semiconductor circuit are reduced compared to the normal operating state. That is to say, if the semiconductor circuit fails in the normal operating state, consequences may be more severe, for example to the system, its components, or a user of the system, than in the safe operating state.

In some embodiments the safety monitoring circuit may be mounted in a vehicle. The system may comprise a plurality of circuits in the vehicle. The control module may be configured to apply a safety measure to at least one circuit of the system if the activation signal is received. In a vehicle there may be a plurality of safety relevant circuits and failure of one circuit may have consequences for an overall safety of the vehicle. In some embodiments mechanical stress overload of the semiconductor may lead to application of safety measure to other circuits. A stress safety criterion of the vehicle may therefore be maintained taking into account possible failure of the semiconductor. For example, a control unit of a vehicle may switch the vehicle to a safety mode, e.g. with reduced maximum speed, ignite a warning light, etc., when the activation signal indicates a mechanical stress overload of, for example, a break control semiconductor circuit.

Embodiments further provide a method for detecting mechanical stress of a semiconductor circuit. The method comprises monitoring mechanical stress of the semiconductor circuit, and providing monitor information related to a mechanical stress level of the semiconductor circuit. The method further comprises generating an activation signal comprising activation information related to the mechanical stress level of the semiconductor circuit if the monitor information indicates that the mechanical stress level criterion is fulfilled by the semiconductor circuit.

Embodiments may further provide a computer program or a computer program product for performing one of the above described methods when the computer program is executed on a computer, a processor, or programmable hardware.

BRIEF DESCRIPTION OF THE DRAWINGS

Some embodiments of apparatuses and/or methods and/or computer programs and/or computer program products will be described in the following by way of example only, and with reference to the accompanying figures, in which.

DETAILED DESCRIPTION OF THE DRAWINGS

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
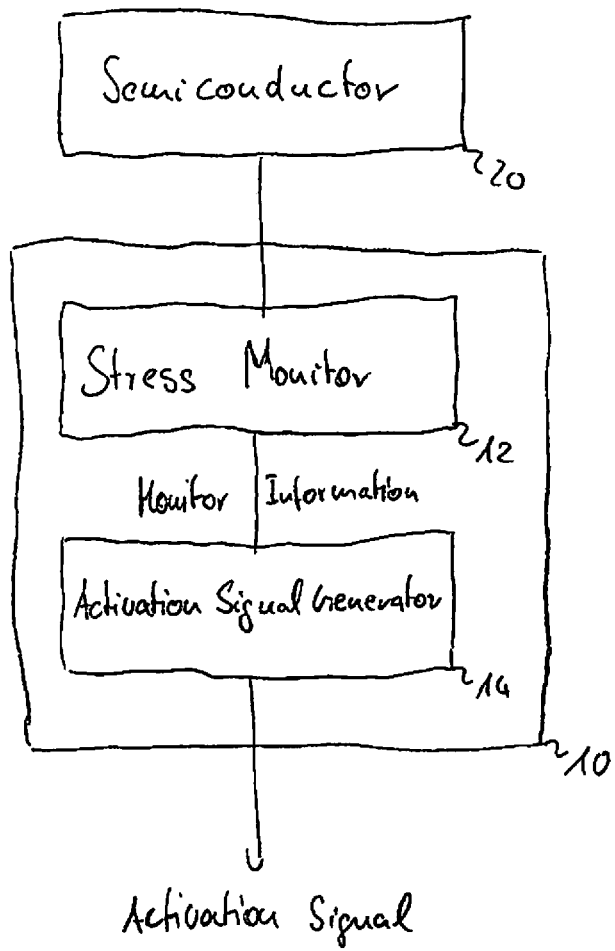
FIG. 1 shows an embodiment of a detection circuit.

FIG. 1 shows an embodiment of a detection circuit 10, which is configured to detect mechanical stress of the semiconductor circuit 20. The detection circuit 10 comprises a stress monitor 12, which is configured to monitor mechanical stress of the semiconductor circuit 20. The stress monitor module 12 is further configured to provide monitor information related to a mechanical stress level of the semiconductor circuit 20. The stress monitor module 12 may correspond to any means for monitoring a stress level, e.g. it may receive a measurement signal from a stress sensor or it may comprise a stress sensor. The detection circuit 10 further comprises an activation signal generator 14, which is coupled to the stress monitor 12. The activation signal generator 14 may correspond to any means for generating the activation signal, which may be digital or analog. The activation signal generator 14 is configured to generate an activation signal comprising activation information related to the mechanical stress level of the semiconductor circuit 20 if the monitor information indicates that the mechanical stress level criterion is fulfilled by the semiconductor circuit 20.

In the embodiment shown in FIG. 1 and also in the following embodiments the semiconductor circuit 20 may correspond to any chip or substrate. The activation signal can be used to initiate safety measures, for example, a deactivation of outputs or a generation of warning signals for the case that the stress of the semiconductor circuit 20 exceeds the normal operation conditions. In other words, the activation signal generated by the activation signal generator 14 may be configured to cause an activation of a safety measure. In embodiments the stress monitor module 12 may comprise a mechanical stress sensor coupled to the semiconductor circuit 20. The stress monitor module 12 may be configured to provide the monitor information related to the mechanical stress level of the semiconductor circuit 20 based on at least a resistance or a piezo-resistance measurement at the semiconductor circuit 20. It may as well perform multiple piezo-resistance measurements of resistors with different orientation with respect to the silicon crystal or measurements of resistors with different type or concentration of doping. The multiple measurements may be used to monitor multiple safety criteria related to different directions or types (e.g. linear or shear) of stress or may be combined to create one overall stress monitoring criterion.

In other embodiments multiple stress sensors may be distributed over the chip. They might be placed in locations that are known to be exposed to high stress levels like the chip corners. In other embodiments the locations of stress sensors may be chosen according to the knowledge of potential sources of stress like in the proximity of power devices that may heat up their environment excessively in the case of overload. In further embodiments multiple stress sensors may be placed in the proximity of components that are known to be sensitive to mechanical stress like Hall plates or bipolar transistors used in temperature sensors or bandgap references. The safety criterion to create the activation signal may be generated by one or different combination of the multitude of stress measurements.

Further embodiments may reuse stress sensors that are already integrated on the silicon die, e.g. the stress compensation sensor that is used for the compensation of the stress dependence of a Hall plate and add deliver its information to the activation signal generator as well as to the compensation electronics.

In other words in embodiments the stress monitor module 12 can be configured to determine information on a mechanical stress of the surfaces of the semiconductor circuit 20. For example, the mechanical stress may correspond to forces acting on the surfaces of the semiconductor circuit 20, which lead to stress. In embodiments, the stress may be determined in several components, such as normal components and shear components. In some embodiments the stress in the material can be the derivation of the force with respect to the area at a certain point in the material. For example, applied stress forces may lead to deformations of the material of the semiconductor circuit 20. In some embodiments the stress monitor module 12 may be configured to determine a relative change of a dimension or the geometry of the semiconductor circuit 20 under stress. Some embodiments may make use of known material properties and laws, such as, for example, the Poisson ratio. The Poisson ratio may link, for example, height and width to an increase in length of the respective semiconductor circuit material.

In other words, under shear stress the geometry of the semiconductor material may change. For example, a shear angle may be considered as the deviation of the angle between the edges deviating from rectangular shapes, i.e. deviating from an angle of $\pi/2$. Furthermore, Hooke's law describes the relation of stress and strain or shear for an elastic region. As mentioned before, Hooke's law may also be used to determine multidimensional deformations of a body under stress, for example, by means of determining strain and shear angles. In some embodiments a strain gauge may be used to measure or determine a change in the geometry of the semiconductor circuit 20. For example, the strain gauge may be integrated or coupled to the semiconductor circuit 20, such that a change in geometry of the gauge also changes its resistance due to the applied stress. This may lead to a relation where its resistance increases with tensile stress being applied. In some embodiments metal films may be used as resistors for these strain gauges.

In further embodiments piezo-resistivity may be used to determine a mechanical stress of the semiconductor circuit 20. For some materials it may be found that a gauge factor is significantly higher than expected from mechanical form variation, which can be due to piezo-resistivity. Piezo-resistivity describes the dependence of a specific resistance on the applied stress. Such an effect may occur in mono-crystalline material, e.g. silicon or germanium, as it can be used for the semiconductor circuit 20. Piezo-resistivity may be measured along multiple dimensions, for example, using three Cartesian dimensions. Piezo-resistivity may be described with fourth rank tensor relating to two second rank tensors. In other words, in embodiments piezo-resistivity may be used to determine the mechanical stress of the semiconductor circuit 20 and multiple dimensions may be used such as axial stress, orthogonal stress and shear stress. The piezo-resistivity of the semiconductor circuit 20 may depend on the doping type and doping density of its substrate. Moreover, in some embodiments directions of the piezo-resistivity may depend on a direction relative to a crystal orientation. Different wafer materials may have different orientations with respect to the surface and thus the same layout of piezo-resistors may lead to different sensitivities in these directions. In embodiments resistance measurements may be carried out along different spatial dimensions of a substrate of the semiconductor circuit 20. For example, in some embodiments at least two different spatial dimensions may be used for resistance measurements. That is to say that resistors measured, be they implanted into the substrate or a substrate layer itself, may therefore have spatially separated contacts on the semiconductor surface 20, wherein the direction from one contact to another is oriented in the at least two different spatial dimensions.

In some embodiments the mechanical stress level criterion may correspond to exceedance of a stress safety criterion. For example, stress safety criteria may be defined in terms of a certain range of mechanical stress, which is acceptable without violating the safety integrity of the semiconductor circuit 20 or a system the semiconductor circuit 20 is comprised in. Moreover, thresholds or stress safety criteria separating acceptable mechanical stress levels from unacceptable mechanical stress levels may be defined. In some embodiments the activation signal may comprise information related to a warning such that a stress safety criterion is exceeded. The activation signal may then serve to trigger safety measures, as will be detailed subsequently.

In further embodiments the activation signal generator 14 may be configured to determine information related to a mechanical stress level change. That is to say that some embodiments may react to stress level changes and thus the stress level criterion may be defined as the maximum stress level change, which may relate to a given period or lapse of time. The activation signal generator 14 may then be configured to generate the activation signal based on the information related to the stress level change. In further embodiments the activation signal generator 14 may be configured to determine information related to a mechanical stress level change rate, which may correspond to a time derivative of the stress level or a stress level change per time unit of the stress level. For example, the stress level change rate may be high, when sudden stress level changes occur. The activation signal generator 14 may then be configured to generate the activation signal based on the information related to the mechanical stress level change rate. Furthermore, in some embodiments the activation signal generator 14 may be configured to generate the activation signal when a mechanical failure of the semiconductor is detected based on a mechanical stress level change rate exceeding a mechanical stress level change rate criterion. That is to say that in some embodiments the stress level criterion may correspond to a stress level change rate criterion. If a substrate of a semiconductor circuit 20 breaks, cracks or fractures occur, there may be a peak or a step in the corresponding stress level change rate.

In different embodiments the stress monitor and the activation signal generator may be located on different semiconductors. In such embodiments the stress monitor could be a piezo-resistive sensor that is located on a power semiconductor and deliver an analog output signal to another semiconductor e.g. a microcontroller that reads the analog signal via its analog-to-digital converter. In this kind of embodiment the activation signal generator could be a part of the controller software. In other embodiments the activation signal generator could be a part of the same semiconductor as the stress monitor and could generate a "chip ok"-signal or code or code sequence that is sent out in defined time intervals in order to make sure that an activation signal is recognized as well if the activation signal generator has a malfunction due to the overstress situation.

Figure 2:
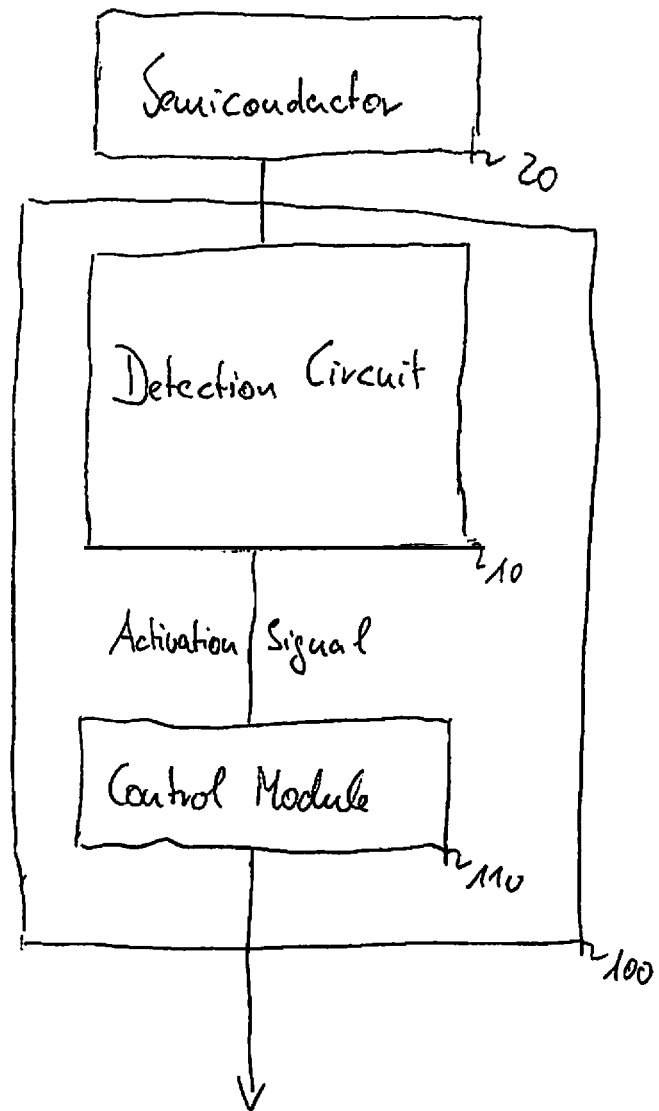
FIG. 2 shows an embodiment of a safety monitor circuit.

FIG. 2 illustrates an embodiment of a safety monitoring circuit 100. The safety monitoring circuit is configured to monitor a system. The safety monitoring circuit comprises a detection circuit 10 as described above. Moreover, the safety monitoring circuit 100 comprises a control module 110, which is configured to receive the activation signal from the activation signal generator 14 of the detection circuit 10. The control module 110 is further configured to apply a safety measure to the system if the activation signal is received. The control module 110 may correspond to any means for controlling, e.g. any processing entity, such as any kind of processor, programmable hardware, etc.

In some embodiments measurement of at least one of the relevant stress components, for example three linear and three shear stress directions, may be carried out by the detection circuit 10. The activation signal generator 14 can be configured to compare these stress levels with corresponding tolerance levels. If this tolerance level is exceeded it may lead to the initiation of the safety measure by the safety monitoring circuit 100, which may be defined depending on the respective application. In some embodiments the stress measurements can be extended to multiple, for example up to three stress components that describe a full stress state of the silicon die of the semiconductor circuit 20 with dimensions as described above. The measured stress components may be evaluated separately or they may be combined, for example, by a mathematical equation. In some embodiments measurements can be extended to detect unacceptable changes of the stress, which indicate that an unacceptable change of the operation conditions appeared. Reasons could be massive stress from the application environment due to mechanical damage or internal stress sources like temperature expansion due to electrical faults. In embodiments possible safety measures that may be initiated can, for example, be bringing the system into a safe state, for example, by turning off output drivers or reset the whole chip or semiconductor circuit 20. Another possible safety measure would be a report of an error to a higher level instance.

In line with the above, the safety monitoring circuit 100, the control module 110 comprised therein, respectively, may be configured to maintain a stress safety criterion of the system based on the activation signal. That is to say that the control module 110 is configured to trigger or to carry out certain actions upon reception of the activation signal. Some embodiments may be divided into two groups, where in the first group such safety measures may be carried out on the chip or a semiconductor circuit itself, as, for example, the deactivation of certain ports or connectors. In the second group safety measures are carried out outside the chip or semiconductor circuit 20 on other components or units of the system.

The system may, for example, be an automotive system, i.e. it may comprise multiple semiconductors, which are implemented in or on a vehicle, such as a car, a van, a truck, etc. In other applications the system may correspond to a system of semiconductors implemented in a plane, a train, etc. Yet other systems may comprise semiconductor circuits in power plants, computers or computer systems, communication systems, etc. In some embodiments the control module 110 is configured to switch the system or the semiconductor circuit 20 at least partly off if the activation signal is received. That is to say that the safety measure may be triggered by the activation signal. The activation signal may comprise measurement results or it may comprise an instruction, which, at least in some embodiments, may be represented by a single bit. A single bit may be used to indicate to the control module 110 that the stress level criterion has been met on the semiconductor circuit 20. The activation signal may therefore be considered as a warning signal.

In line with general system definitions, the physical signal corresponding to the activation signal may be defined by one or more protocols. In some implementations or applications the activation signal may correspond to a certain error code, signaling that the mechanical stress level criterion was met on the semiconductor circuit 20. In some embodiments the safety measure is applied to the semiconductor circuit 20 itself. For example, power components of the semiconductor circuit may be switched off. In another embodiment a driver for another power component may be switched off. That is to say that in some embodiments the actual safety measure may be triggered by the detection circuit 10 at the safety monitoring circuit 100 based on the mechanical stress of the semiconductor circuit 20 but carried out outside the semiconductor circuit 20.

In further embodiments the control module 110 can be configured to reset the semiconductor circuit 20 or at least one component of the system if the activation signal is received. In other words, another safety measure is a reset or a reboot of a component such as the semiconductor circuit 20 or another component of the system. Other safety measures could be an ignorance of a sensor signal, for example, of a sensor measuring the mechanical stress, and to take into consideration another sensor signal of another sensor, which can be also sensing the mechanical stress level of the semiconductor circuit 20. Another safety measure can be to interpret the activation signal as a warning sign for other units or even a user, for example, the driver of a vehicle. Moreover, especially when considering the system in a vehicle, other functionalities in the vehicle may be deactivated upon reception of the activation signal. In further embodiments support systems for a driver, e.g. for an automatic driving function, may be activated or their settings may be modified upon reception of the activation signal. That is to say that upon reception of the activation signal in some embodiments a warning may be initiated, for example, a warn signal to a driver or a user of the system.

In a further embodiment the control module 110 is configured to transfer the semiconductor circuit 20 or the system from a normal operating state into a safe operating state if the activation signal is received. The safe operating state is a state in which consequences of a failure of the semiconductor circuit 20 are reduced compared to the normal operating state. The transfer of the state may be triggered on the semiconductor circuit 20 itself or at any other point in the system. For example, in case of a sensor, i.e. the semiconductor circuit 20 corresponds to a sensor sensing any physical quantity; the activation signal may lead to prohibit the sensor signal from being further used in the system. Another safety measure would be to inform relevant components of the system about the faulty sensor, for example, by using a corresponding error code or suppressing the transmission of a "sensor ok"-code. In some embodiments the safe state or safe operating state may be a system level state and it may depend on the respective system. In other words, in different systems it may correspond to different states. For example, if actuators or actors are monitored, the respective actor or actuator may be switched off upon reception of the activation signal.

A safety measure may also be referred to as a fail silent measure, as upon failure the respective component is turned silent. In other embodiments sensor signals may be ignored and redundant sensors may be used, for which the mechanical stress level criterion has not been met. Such embodiments may also be referred to as fail operational (if the specification of the system is still achieved) or fail degraded (if some specification parameters are relaxed) safety measures. The redundant sensors may be identical or different devices located on a level above the silicon that reports the overstress. In other embodiments the redundant sensor information could be supplied by sensors in other regions of the same silicon die for which the mechanical stress is still in an acceptable range. The control module 110 may then turn to the safe operating state, which may also be an emergency state, and missing information may as well be estimated based on other sources. For example, in some embodiments if a crank shaft sensor fails, an emergency program of a control unit may be started using already known data from the cam shaft sensor. Moreover, in some embodiments an emergency signal such as an emergency light in a dashboard or cockpit may be activated.

In further embodiments the control module 110 can be configured to control at least one additional semiconductor circuit. The control module 110 may be further configured to apply a safety measure to the at least one additional semiconductor circuit if the activation signal is received. For example, in some embodiments an actuator or actor, as, for example, a driver for an airbag ignition tablet, may be monitored. In this case the safe operating state may be activated by interrupting a current path to the respective actor. In other words, a switch in a current path or branch may be opened. Upon failure detection, accidental ignition of the airbag may then be avoided. Generally, an error code may be sent to other components of the system such that further system wide safety measures can be taken. In some embodiments only an error code may be informed or broadcast throughout the system. Other components may then be warned that the mechanical stress situation at the respective semiconductor circuit 20 was considered too high.

Moreover, it may be considered that further failures may also affect certain switch off procedures. Moreover, in some embodiments none essential functions may be switched off in order to release the stress of the component. For example, in a car in an emergency mode, the maximum speed may be reduced using a control unit. With reducing the maximum speed, mechanical stress in terms of shocks, distortion, temperature, may be released and an emergency mode of the semiconductor circuit 20 may be enabled. Such safety measures may be applied to functions with low Automotive Safety Integrity Levels (ASIL) as, for example, switching a power window to a mode, in which the window can only be closed or opened very slowly and thus reduced maximum force. In further embodiments the system may comprise a plurality of circuits in a vehicle and the control module 110 can be configured to apply a safety measure to at least one circuit of the system if the activation signal is received.

Figure 3:
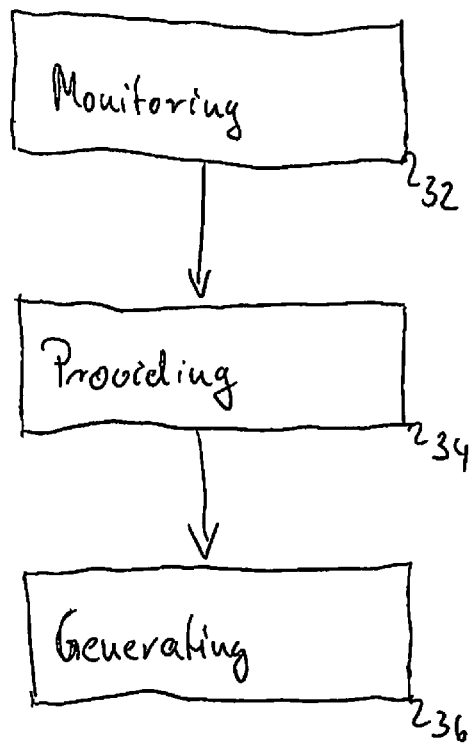
FIG. 3 shows a block diagram of a flowchart of an embodiment of a method for detecting mechanical stress.

FIG. 3 illustrates a block diagram of a flowchart of an embodiment of a method for detecting mechanical stress of a semiconductor circuit 20. The method comprises monitoring 32 mechanical stress of the semiconductor circuit 20. The method further comprises providing 34 monitor information related to a mechanical stress level of the semiconductor circuit 20. The method further comprises generating 36 an activation signal comprising activation information related to the mechanical stress level of the semiconductor circuit 20 if the monitor information indicates that the mechanical stress level criterion is fulfilled by the semiconductor circuit 20.

In further embodiments the method may be configured to monitor a system in line with the above description. The system comprises the semiconductor circuit 20. The method may then further comprise receiving the activation signal and applying a safety measure to the system when the activation signal is received.

Embodiments further provide a computer program or a computer program product with a computer program for carrying out one or more of the above described method, when a computer program is executed on a computer, processor or software programmable hardware.

A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for monitoring", "means for generating", "means for controlling", etc., may be provided through the use of dedicated hardware, such as "a monitor", "a generator", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The invention claimed is:

1. A detection circuit configured to detect mechanical stress level change of a semiconductor circuit, the detection circuit comprising:
    a stress monitor module configured to monitor a mechanical stress level change of the semiconductor circuit with respect to a previously detected mechanical stress level and to provide monitor information related to the mechanical stress level change of the semiconductor circuit; and
    an activation signal generator configured to generate an activation signal comprising activation information related to the mechanical stress level change of the semiconductor circuit when the monitor information indicates that a mechanical stress level change criterion is fulfilled by the semiconductor circuit, wherein the activation signal indicates a mechanical failure or a break of the semiconductor circuit.

2. The detection circuit of claim 1, wherein the stress monitor module comprises a mechanical stress sensor coupled to the semiconductor circuit and wherein the stress monitor module is configured to provide the monitor information related to the mechanical stress level of the semiconductor circuit based on at least a resistance or a piezo-resistance measurement at the semiconductor circuit.

3. The detection circuit of claim 2, wherein the resistance measurement is carried out along at least two different spatial dimensions of a substrate of the semiconductor circuit.

4. The detection circuit of claim 1, wherein the mechanical stress level change criterion corresponds to exceedance of a stress safety criterion and wherein the activation signal comprises information related to a warning that the stress safety criterion is exceeded.

5. The detection circuit of claim 1, wherein the activation signal generator is configured to determine information related to a mechanical stress level change rate and to generate the activation signal based on the information related to the mechanical stress level change rate.

6. The detection circuit of claim 5, wherein the activation signal generator is configured to generate the activation signal when a mechanical failure of the semiconductor is detected based on a mechanical stress level change rate exceeding a mechanical stress level change rate criterion.

7. The detection circuit of claim 1, wherein the activation signal generated by the activation signal generator is configured to cause an activation of a safety measure.

8. A safety monitoring circuit being configured to monitor a system, comprising:
    the detection circuit of claim 1; and
    a control module configured to receive the activation signal from the activation signal generator and to apply a safety measure to the system when the activation signal is received.

9. The safety monitoring circuit of claim 8, wherein the control module is configured to switch the system or the semiconductor circuit at least partly off when the activation signal is received.

10. The safety monitoring circuit of claim 8, wherein the control module is configured to switch a power component or a driver of a power component of the system off when the activation signal is received.

11. The safety monitoring circuit of claim 8, wherein the control module is configured to reset the semiconductor circuit or at least one component of the system when the activation signal is received.

12. The safety monitoring circuit of claim 8, wherein the control module is configured to transfer the semiconductor circuit or the system from a normal operating state into a safe operating state if the activation signal is received, the safe state being a state in which consequences of a failure of the semiconductor circuit being reduced compared to the normal operating state.

13. The safety monitoring circuit of claim 8, wherein the control module is configured to control at least one additional semiconductor circuit outside the semiconductor circuit, and wherein the control module is configured to apply a safety measure to the at least one additional semiconductor circuit if the activation signal is received.

14. The safety monitoring circuit of claim 8, wherein the system comprises a plurality of circuits in a vehicle, and wherein the control module is configured to apply a safety measure to at least one circuit of the system if the activation signal is received.

15. The detection circuit of claim 1, wherein a fulfillment of the mechanical stress level change criterion corresponds to an exceeding of a pre-determined maximum stress level change.

16. A safety monitoring circuit configured to monitor a system, comprising:

a stress monitor module configured to monitor a mechanical stress level change of a semiconductor circuit and to provide monitor information related to the mechanical stress level change of the semiconductor circuit;

an activation signal generator configured to generate an activation signal comprising activation information related to the mechanical stress level change of the semiconductor circuit when the monitor information indicates that a mechanical stress level change criterion is fulfilled by the semiconductor circuit; and a control module configured to receive the activation signal from the activation signal generator and to apply a safety measure when the activation signal is received;

wherein the control module is configured to apply the safety measure to components outside the semiconductor circuit when the activation signal is received.

17. A method for detecting mechanical stress level change of a semiconductor circuit, the method comprising:

monitoring a mechanical stress level change of the semiconductor circuit with respect to a previously detected mechanical stress level;

providing monitor information related to the mechanical stress level change of the semiconductor circuit; and generating an activation signal comprising activation information related to the mechanical stress level change of the semiconductor circuit when the monitor information indicates that a mechanical stress level change criterion is fulfilled by the semiconductor circuit, wherein the activation signal indicates a mechanical failure or a break of the semiconductor.

18. The method of claim 17 configured to monitor a system comprising the semiconductor circuit, the method further comprising:

receiving the activation signal; and applying a safety measure to the system when the activation signal is received.

19. The detection circuit of claim 17, wherein a fulfillment of the mechanical stress level change criterion corresponds to an exceeding of a pre-determined maximum stress level change.

* * * * *